(12) United States Patent
Joshi et al.

(10) Patent No.: US 10,879,209 B2
(45) Date of Patent: Dec. 29, 2020

(54) ENCAPSULATED STRESS MITIGATION LAYER AND POWER ELECTRONIC ASSEMBLIES INCORPORATING THE SAME

(71) Applicant: Toyota Motor Engineering & Manufacturing North America, Inc., Plano, TX (US)

(72) Inventors: Shailesh N. Joshi, Ann Arbor, MI (US); Naoya Take, Canton, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/880,126

(22) Filed: May 21, 2020

(65) Prior Publication Data
US 2020/0286849 A1 Sep. 10, 2020

Related U.S. Application Data

(63) Continuation of application No. 16/165,635, filed on Oct. 19, 2018, now Pat. No. 10,700,036.

(51) Int. Cl.
*H01L 23/00* (2006.01)
*H01L 23/22* (2006.01)
(Continued)

(52) U.S. Cl.
CPC .............. *H01L 24/33* (2013.01); *H01L 23/22* (2013.01); *H01L 23/4275* (2013.01);
(Continued)

(58) Field of Classification Search
CPC ... H01L 23/4275; H01L 23/427; H01L 23/22; H01L 2224/32503; H01L 2224/8381;
(Continued)

(56) References Cited

U.S. PATENT DOCUMENTS 5,831,831 A * 11/1998 Freeland ............. H01L 23/4275
361/704
6,181,558 B1 * 1/2001 Gordon ............... H01L 23/4275
165/104.33
(Continued)

*Primary Examiner* — Victoria K. Hall
(74) *Attorney, Agent, or Firm* — Dinsmore & Shohl LLP

(57) ABSTRACT

Encapsulated stress mitigation layers and assemblies having the same are disclosed. An assembly that includes a first substrate, a second substrate, an encapsulating layer disposed between the first and second substrates, and a stress mitigation layer disposed in the encapsulating layer such that the stress mitigation layer is encapsulated within the encapsulating layer. The stress mitigation layer has a lower melting temperature relative to a higher melting temperature of the encapsulating layer. The assembly includes an intermetallic compound layer disposed between the first substrate and the encapsulating layer such that the encapsulating layer is separated from the first substrate by the intermetallic compound layer. The stress mitigation layer melts into a liquid when the assembly operates at a temperature above the low melting temperature of the stress mitigation layer and the encapsulating layer maintains the liquid of the stress mitigation layer within the assembly.

20 Claims, 6 Drawing Sheets

(51) Int. Cl.
*H01L 23/427* (2006.01)
*H01L 23/34* (2006.01)

(52) U.S. Cl.
CPC .............. *H01L 24/29* (2013.01); *H01L 24/32* (2013.01); *H01L 24/83* (2013.01); *H01L 23/34* (2013.01); *H01L 2224/29083* (2013.01); *H01L 2224/29084* (2013.01); *H01L 2224/29109* (2013.01); *H01L 2224/29111* (2013.01); *H01L 2224/29169* (2013.01); *H01L 2224/32245* (2013.01); *H01L 2224/32503* (2013.01); *H01L 2224/3303* (2013.01); *H01L 2224/8381* (2013.01); *H01L 2224/8382* (2013.01); *H01L 2224/8383* (2013.01); *H01L 2924/3512* (2013.01)

(58) Field of Classification Search
CPC ..... H01L 2224/8382; H01L 2224/8383; H01L 2224/29083; H01L 2224/29084; H01L 24/29; H01L 24/32; H01L 24/33
USPC .................. 257/712, 713; 428/576
See application file for complete search history.

(56) References Cited

U.S. PATENT DOCUMENTS

| | | | |
|---|---|---|---|
| 6,261,871 B1 * | 7/2001 | Langari | H01L 21/48 438/124 |
| 6,316,826 B1 | 11/2001 | Yamamoto et al. | |
| 6,534,792 B1 | 3/2003 | Schaffer | |
| 6,703,128 B2 | 3/2004 | Myers et al. | |
| 7,202,569 B2 | 4/2007 | Tomono | |
| 7,554,190 B2 * | 6/2009 | Macris | H01L 23/26 257/706 |
| 8,381,964 B2 | 2/2013 | Liu et al. | |
| 9,847,311 B2 | 12/2017 | Kadoguchi | |
| 10,437,083 B1 | 10/2019 | Baleine et al. | |
| 10,485,091 B2 | 11/2019 | Molla et al. | |
| 10,495,387 B2 | 12/2019 | Zhou et al. | |
| 10,509,447 B2 | 12/2019 | Damaraju et al. | |
| 10,700,036 B2 * | 6/2020 | Joshi | H01L 23/3121 |
| 2003/0143958 A1 * | 7/2003 | Elias | H01L 23/3733 455/73 |
| 2006/0186550 A1 * | 8/2006 | Ikeda | H01L 24/83 257/772 |
| 2009/0149021 A1 | 6/2009 | Hillman et al. | |
| 2013/0224510 A1 * | 8/2013 | Deng | H01L 23/4275 428/576 |
| 2014/0319681 A1 * | 10/2014 | Maohua | H01L 25/105 257/738 |
| 2016/0027759 A1 * | 1/2016 | Plo l | H01L 21/2855 257/741 |
| 2016/0049564 A1 * | 2/2016 | Chu | H01L 33/0093 257/99 |
| 2017/0062304 A1 * | 3/2017 | Joshi | H01L 23/488 |
| 2018/0142923 A1 * | 5/2018 | Prieto Herrera | H01L 23/433 |
| 2020/0051896 A1 | 2/2020 | Canaperi et al. | |
| 2020/0053908 A1 | 2/2020 | Engelhardt et al. | |

* cited by examiner

ENCAPSULATED STRESS MITIGATION LAYER AND POWER ELECTRONIC ASSEMBLIES INCORPORATING THE SAME

CROSS REFERENCE TO RELATED APPLICATION

This application is a continuation application of U.S. patent application Ser. No. 16/165,635, filed Oct. 19, 2018, now U.S. Pat. No. 10,700,036, issued Jun. 30, 2020, which is incorporated in its entirety by reference.

TECHNICAL FIELD

The present specification generally relates to bonding materials for power electronics assemblies, and more particularly, to bonding materials that bond semiconductor devices to substrates and provide stress mitigation of the semiconductor devices.

BACKGROUND

Power electronic devices are often utilized in high-power electrical applications, such as inverter systems for hybrid electric vehicles and electric vehicles. Such power electronic devices include power semiconductor devices such as power insulated-gate bipolar transistors (IGBTs) that are thermally bonded to a substrate. With advances in battery technology in electrified vehicles and increases in electronic device packaging density, operating temperatures of power electronic devices have increased and are currently approaching 200° C. which result in increased thermomechanical stresses endured by the power electronic device. Accordingly, stress mitigation structures or materials for power electronic devices are desired. Due to coefficient of thermal expansion (CTE) differences between the power semiconductor device, the bonding layer, and the substrate, thermally induced stresses may cause damage to the bonded assembly. Although bond layers formed by transient liquid phase bonding results in a bond layer having a high melting temperature greater than 200° C., such TLP bond layers are very hard and brittle. Thus, they are susceptible to thermally induced stress damage.

SUMMARY

In one embodiment, an assembly that includes a first substrate, a second substrate, an encapsulating layer disposed between the first and the second substrates, and a stress mitigation layer disposed in the encapsulating layer such that the stress mitigation layer is encapsulated within the encapsulating layer. The stress mitigation layer has a lower melting temperature relative to a higher melting temperature of the encapsulating layer. The assembly further includes an intermetallic compound layer disposed between the first substrate and the encapsulating layer such that the encapsulating layer is separated from the first substrate by the intermetallic compound layer. The stress mitigation layer melts into a liquid form when the assembly operates at a temperature above the low melting temperature of the stress mitigation layer and the encapsulating layer maintains the liquid form of the stress mitigation layer within the assembly.

In another embodiment, a power electronic assembly including a metal substrate having a bonding surface, a semiconductor device having a corresponding bonding surface, and an intermetallic compound layer bonded to the corresponding bonding surface of the semiconductor device. The assembly further includes a platinum layer bonded to the bonding surface of the metal substrate and the intermetallic compound layer opposite of the semiconductor device, and a stress mitigation layer extending within the platinum layer such that the platinum layer seals the stress mitigation layer between the metal substrate and the intermetallic compound layer. The stress mitigation layer transitions to a liquid state in response to the semiconductor device generating thermal energy.

In another embodiment, a method of manufacturing an assembly that includes a stress mitigation layer having a low melting temperature, the method including encapsulating the stress mitigation layer within an encapsulating layer and positioning the encapsulating layer against a first substrate and a second substrate such that the encapsulating layer is disposed between the first and second substrates. The method further includes positioning an interlayer between the encapsulating layer and the first substrate, the interlayer is formed of a low melting temperature material relative to the encapsulating layer. The method includes heating the assembly such that portions of the interlayer diffuse into the first substrate and the encapsulating layer thereby forming an intermetallic compound layer between the first substrate and the encapsulating layer. The stress mitigation layer melts into a liquid in response to heating the assembly. The method further includes cooling the assembly to solidify the intermetallic compound layer between the encapsulating layer and the first substrate, wherein the stress mitigation layer hardens into a solid in response to cooling the assembly.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
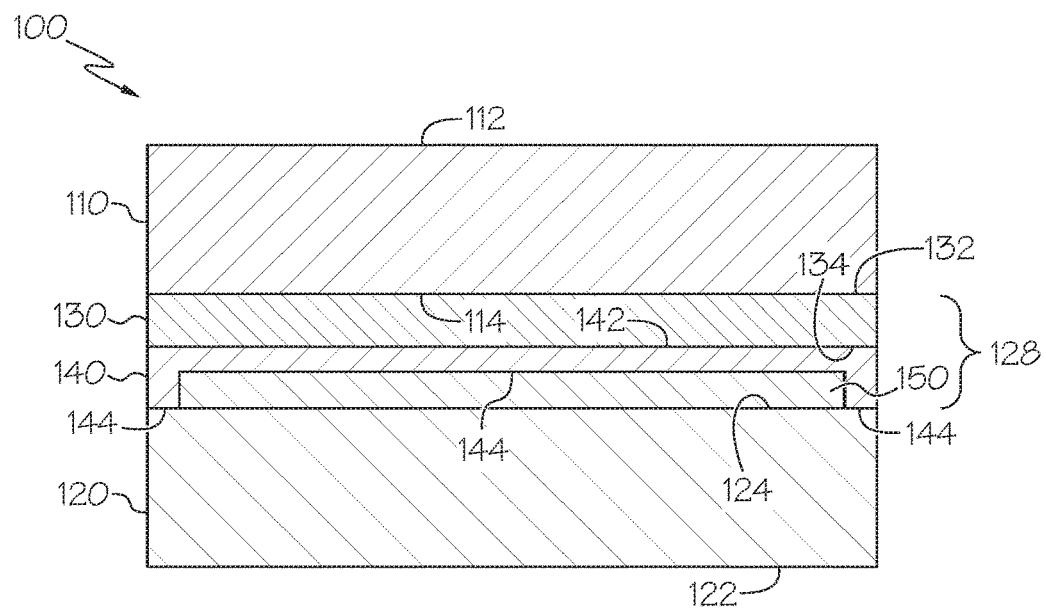
FIG. 1 schematically depicts a cross-sectional view of an assembly having a pair of substrates bonded to one another by a bonding structure including an encapsulated stress mitigation layer according to one or more embodiments shown and described herein.

Embodiments of the present disclosure are directed to assemblies comprising a bonding structure having an encapsulated phase change material layer. More particularly, assemblies including a first substrate bonded to a second substrate by a bonding structure and including an encapsulating layer disposed therein is provided. As used herein, the term "encapsulating layer" refers to a bond layer disposed between a pair of substrates, one of which may be a power semiconductor device, which encapsulates a stress mitigation layer therein. The encapsulating layer is bonded to the first substrate and the second substrate and encapsulates the stress mitigation layer, formed of a phase change material, which is configured to mitigate thermomechanical stresses endured by the semiconductor device during fabrication and operation of the assembly (e.g., a power electronic assembly). In particular, the phase change material is configured to melt into a liquid form within the encapsulating layer when the assembly operates at a temperature above the low melting temperature of the phase change material to reduce thermomechanical stresses generated on the first substrate and/or the second substrate. The encapsulating layer maintains the stress mitigation layer when the phase change material is in a solid form and a liquid form.

The bonding structures described herein include intermetallic compound layers formed by transient liquid phase (TLP) bonding. Transient liquid phase bonding is a joining process utilized to bond metallic systems together, such as an assembly including a pair of substrates (e.g., a power electronic assembly including a power semiconductor device and a substrate). During the transient liquid phase bonding process, low melting temperature materials (e.g., tin, indium, bismuth, and the like) and high melting temperature materials (e.g., copper, aluminum, and the like) are disposed between the first and second substrates to be bonded. The low and high melting temperature materials may be provided in a variety of forms. As one non-limiting example, one or more thin film layers of the high melting temperature material and one or more thin film layers of the low melting temperature material are provided between the pair of substrates.

Alternatively, the low and high melting temperature materials may be provided in particles when the low melting temperature material is the shell and the high melting temperature material is the core, or vice versa. To bond the pair of substrates by transient liquid phase bonding, the assembly is heated to a sintering temperature (e.g., about 280° Celsius to about 300° Celsius for a period of time), which causes the low melting temperature material to melt and form intermetallic bonds with the high melting temperature material. The result is an intermetallic compound bond layer having a re-melting temperature that is greater than the sintering temperature. Thus, the high re-melting temperature intermetallic compound bond layer may be ideal for power electronic device applications where a semiconductor device operates at high operating temperatures, such as greater than 200° Celsius.

Although transient liquid phase bonding layers comprising an intermetallic compound layer have a high re-melting temperature, these layers may be brittle and may crack due to thermally induced stresses caused by operation of the semiconductor device. Thus, it may be beneficial to include one or more stress mitigating layers between the intermetallic compound layers formed by transient liquid phase bonding. In embodiments described herein, stress mitigation layers are formed of a low melting temperature material (e.g., indium, tin, bismuth, and the like) that is encapsulated within a platinum layer, which has a low Young's modulus relative to the intermetallic compound layer described above. Similarly, indium, bismuth, and/or tin also have a Young's modulus that is lower than that of the intermetallic compound layer and the encapsulating layer, and may therefore allow the assembly to flex and bend when the assembly is operated at high operating temperatures. Therefore, an indium or tin material encapsulated by a platinum layer may be useful as a stress mitigation layer.

Figure 2:
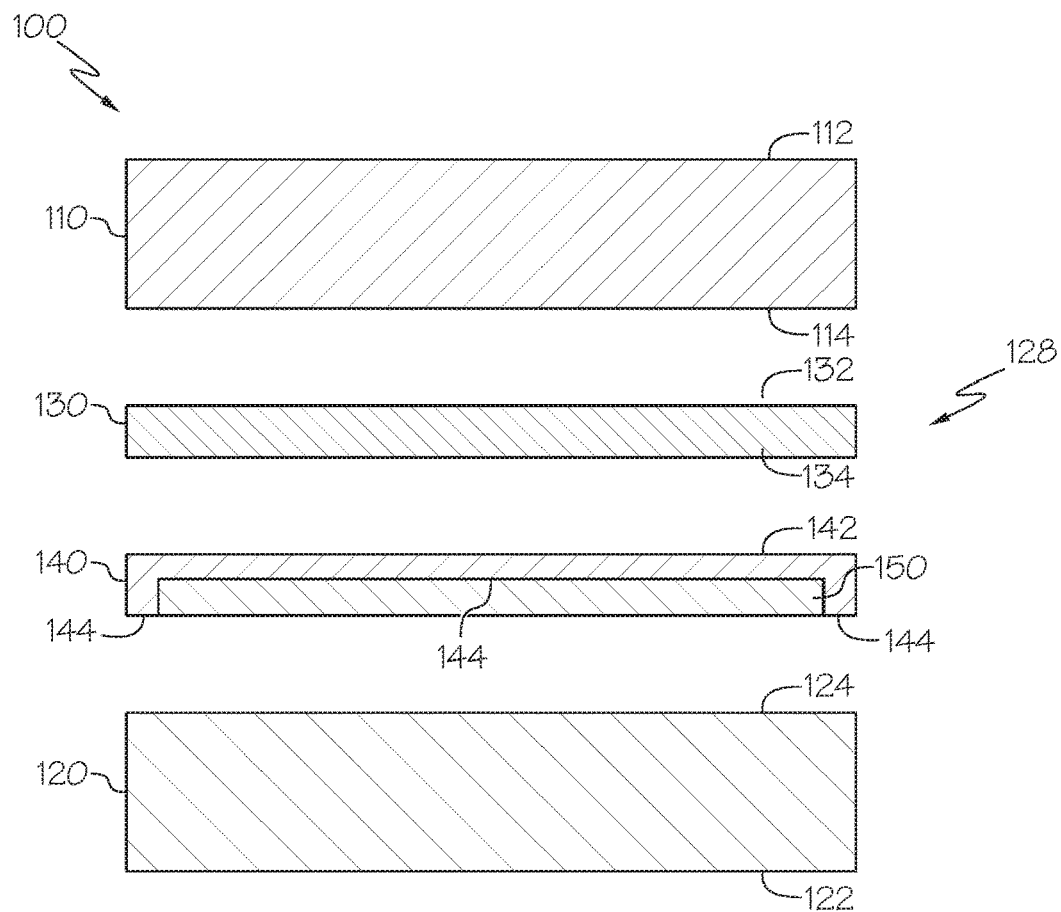
FIG. 2 schematically depicts an exploded cross sectional view of the assembly of FIG. 1 according to one or more embodiments shown and described herein.

Referring now to FIGS. 1-2, a non-limiting example of an assembly 100 (e.g., a power electronics assembly) is schematically illustrated. The assembly 100 generally comprises a first substrate 110 bonded to a second substrate 120 via a bonding structure 128 comprising an encapsulating layer 140 and an intermetallic compound layer 130 disposed between the first substrate 110 and the second substrate 120. As described in more detail below, more or fewer intermetallic compound layers 130 and/or encapsulating layers 140 may be provided between the first substrate 110 and the second substrate 120 of the assembly 100.

The first substrate 110 includes an outer-face 112 and an interface 114, and the second substrate 120 includes an outer-face 122 and an interface 124. The intermetallic compound layer 130 includes a top interface 132 and a bottom interface 134, and the encapsulating layer 140 includes a top interface 142 and a bottom interface 144. The interface 114 of the first substrate 110 is adjacent to the top interface 132 of the intermetallic compound layer 130, and the interface 124 of the second substrate 120 is adjacent to a stress mitigation layer 150 of the assembly 100 and a portion of the bottom interface 144 of the encapsulating layer 140. Accordingly, the top interface 142 of the encapsulating layer 140 is adjacent to the bottom interface 134 of the intermetallic compound layer 130. In this instance, the intermetallic compound layer 130 is isolated from contacting the second substrate 120 by the position of the encapsulating layer 140 disposed therebetween, and the encapsulating layer 140 is isolated from contacting the first substrate 110 by the position of the intermetallic compound layer 130 formed therebetween.

The first substrate 110 may be any component. In some embodiments, the first substrate 110 may be formed from a wide band gap semiconductor material suitable for the manufacture or production of power semiconductor devices such as power insulated-gate bipolar transistors (IGBTs), power diodes, power metal-oxide-semiconductor field effect transistors (MOSFETs), power transistors, and the like. In some embodiments, the first substrate 110 may be formed from wide band gap semiconductor materials including without limitation silicon carbide (SiC), aluminum nitride (AlN), gallium nitride (GaN), boron nitride (BN), diamond, and the like.

In one embodiment, the first substrate 110 of one or more power electronics assemblies are electrically coupled to form an inverter circuit or system for vehicular applications, such as for hybrid vehicles or electric vehicles, for example. It should be understood that although the first substrate 110 is referred to as a power semiconductor device in the present example, in some embodiments, the assembly 100 may include other heat generating devices bonded to the second substrate 120. The first substrate 110 may be thermally coupled to the encapsulating layer 140, and the stress mitigation layer 150 encapsulated therein, via the intermetallic compound layer 130 disposed therebetween.

The second substrate 120 may be any type of substrate for power semiconductor device assemblies. Non-limiting examples include metal substrates such as copper (Cu), oxygen free Cu, aluminum (Al), Cu alloys, Al alloys, and the like. As will be described in greater detail herein, the second substrate 120 may be formed from a thermally conductive material such that heat from the first substrate 110 is transferred to the encapsulating layer 140 that is disposed between the first substrate 110 and the second substrate 120. The second substrate 120 may be thermally coupled to the encapsulating layer 140 via the direct bond with the encapsulating layer 140 along the interface 124. In some embodiments, the second substrate 120 may be further coupled to a cooling structure, such as, for example, a liquid cooler, a heat sink, vapor chamber, or any other form of cooling device, that is operable to lower an operating temperature of the second substrate 120.

The intermetallic compound layer 130 may be any intermetallic component. In some embodiments, the intermetallic compound layer 130 may comprise a thermally conductive interface layer formed within the assembly 100 by transient liquid phase (TLP) bonding of the encapsulating layer 140 and the substrates 110, 120. As described in more detail below, as the assembly 100 is heated during TLP bonding at a TLP sintering temperature (e.g., about 280° Celsius to about 300° Celsius), a low melting temperature material melts and becomes partially diffused into a high melting temperature material of the first substrate 110 (e.g., copper or nickel), thereby forming an intermetallic compound layer 130 between the remaining, undiffused portion of the encapsulating layer 140 and the first substrate 110. The high material temperature material may be provided as a layer of the first substrate 110 as well as additional pre-bonding high melting temperature material thin film layers or particles.

The encapsulating layer 140 may be any solid interlayer of the assembly 100. In the present example, the encapsulating layer 140 may be formed of platinum, copper, high purity aluminum, and/or the like. In these embodiments, the encapsulating layer 140 is configured to be directly deposited onto the stress mitigation layer 150 to serve as an encapsulation layer for the stress mitigation layer 150. It should be understood that the encapsulating layer 140 may be electroplated onto the stress mitigation layer 150 by any known or yet-to-be-developed process. As will be described in greater detail herein, electroplating a substrate with a stress mitigation layer encapsulated therein provides enhanced performance for the assembly 100, and in particular, improves the high temperature operability of the assembly 100.

The encapsulating layer 140 includes the stress mitigation layer 150 disposed therein such that the encapsulating layer 140 encapsulates the stress mitigation layer 150 between the top interface 142 of the encapsulating layer 140 and the interface 124 of the second substrate 120. Accordingly, at least a portion of the bottom interface 144 of the encapsulating layer 140 is deposited against the interface 124 of the second substrate 120, thereby bonding the encapsulating layer 140 to the second substrate 120 and sealing the stress mitigation layer 150 between the bottom interface 144 of the encapsulating layer 140 and the interface 124 of the second substrate 120. The stress mitigation layer 150 is a phase change material formed of a low melting temperature material (e.g., indium, tin, bismuth, low-melting alloy, and the like) and has a lower melting temperature relative to the higher melting temperatures of the intermetallic compound layer 130 and the encapsulating layer 140. The phase change material changes phase at a temperature (i.e., a phase change temperature) within an operating temperature range of the assembly 100, and in particular the first substrate 110. In some embodiments, the low melting temperature of the stress mitigation layer 150 may be about 156° Celsius such that the stress mitigation layer 150 is configured to melt into a liquid form within the encapsulating layer 140 in response to the temperature of the assembly 100 exceeding the low melting temperature of the stress mitigation layer 150 (i.e., about 156° Celsius). As will be described more herein, the stress mitigation layer 150 is configured to mitigate thermomechanical stresses of the assembly 100 when in the liquefied form. In particular, with the stress mitigation layer 150 melted into liquid form, the assembly 100 is allowed to flex in response to the thermal expansion and/or contraction of the various components of the assembly 100. Further, the change in phase of the stress mitigation layer 150 may provide heat absorption from the heat generated by the first substrate 110, thereby increasing the heat capacity of the stress mitigation layer 150 and enabling the stress mitigation layer 150 to remove an amount of heat from the first substrate 110.

It should be understood that in some embodiments the phase change of the stress mitigation layer 150 may be a change in phase between solid and liquid phases, and in other embodiments the change in phase may be between two solid phases, such as between an amorphous solid phase and a crystalline or partially crystalline solid phase. The phase change material of the stress mitigation layer 150 may be water insoluble, may include a paraffin, and/or may include a metal. Paraffin phase change materials may include paraffin waxes comprising one or a plurality of saturated hydrocarbons having at least 20 carbon atoms, such as from 20 to 40 carbon atoms and a melt temperature in a range of 50° Celsius to 250° Celsius. As briefly described above, phase change materials formed of metal may include but are not limited to tin (Sn), indium (In), tin alloys, indium alloys, gallium, N-eicosane (organic), other metals having melting temperatures of about 50° Celsius to 250° Celsius, or combinations of these.

With the stress mitigation layer 150 being formed of a low melting temperature material, such as indium or tin, the stress mitigation layer 150 has a relatively low stiffness (e.g., about 11 GPa). As used herein, the term stiffness refers to the elastic modulus (commonly referred to as Young's modulus) of a material, i.e. a measure of a material's resistance to being deformed elastically when a force is applied to the material. The stiffness of the stress mitigation layer 150 described herein can be varied by varying the purity of the material (i.e., the indium, tin, bismuth, and the like). Therefore, the stress mitigation layer 150 is configured to mitigate thermomechanical stresses of the assembly 100 even when in the solid form due to the low Young's modulus of the stress mitigation layer 150.

With the encapsulating layer 140 and the second substrate 120 positioned about the stress mitigation layer 150 that is encapsulated therebetween, the encapsulating layer 140 and the second substrate 120 maintain the stress mitigation layer 150 between the interfaces 144, 124 of the encapsulating layer 140 and the second substrate 120, respectively, when the stress mitigation layer 150 is in both a solid form and a liquid form. Accordingly, when the assembly 100 operates at temperatures exceeding the low melting temperature of the stress mitigation layer 150 (e.g., at or above 156° Celsius), the encapsulating layer 140 and the second substrate 120 are configured to maintain the liquid stress mitigation layer 150 within the assembly 100 and inhibit the stress mitigation layer 150 from leaking out of the assembly 100 while the stress mitigation layer 150 is in the liquid state.

Figure 3:
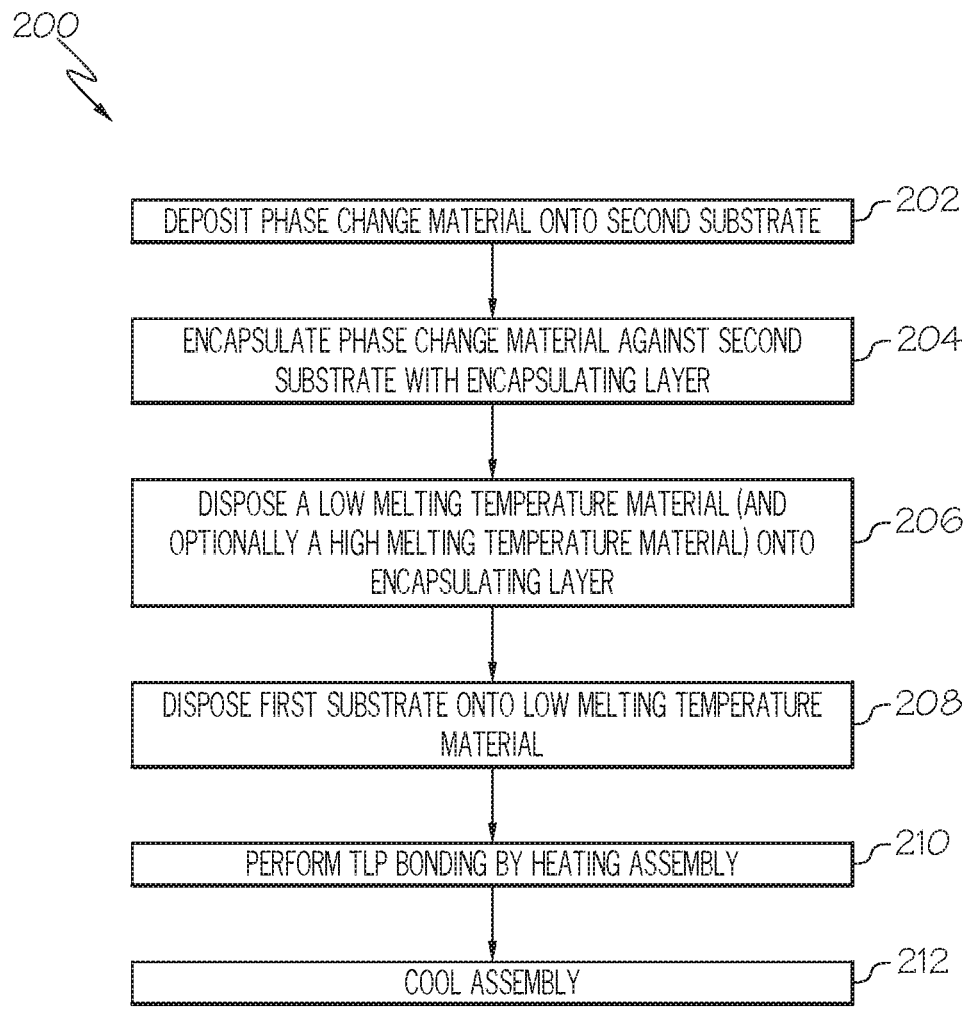
FIG. 3 is a flow chart of a method for fabricating the assembly of FIG. 1 according to one or more embodiments shown and described herein.
Figure 4A:
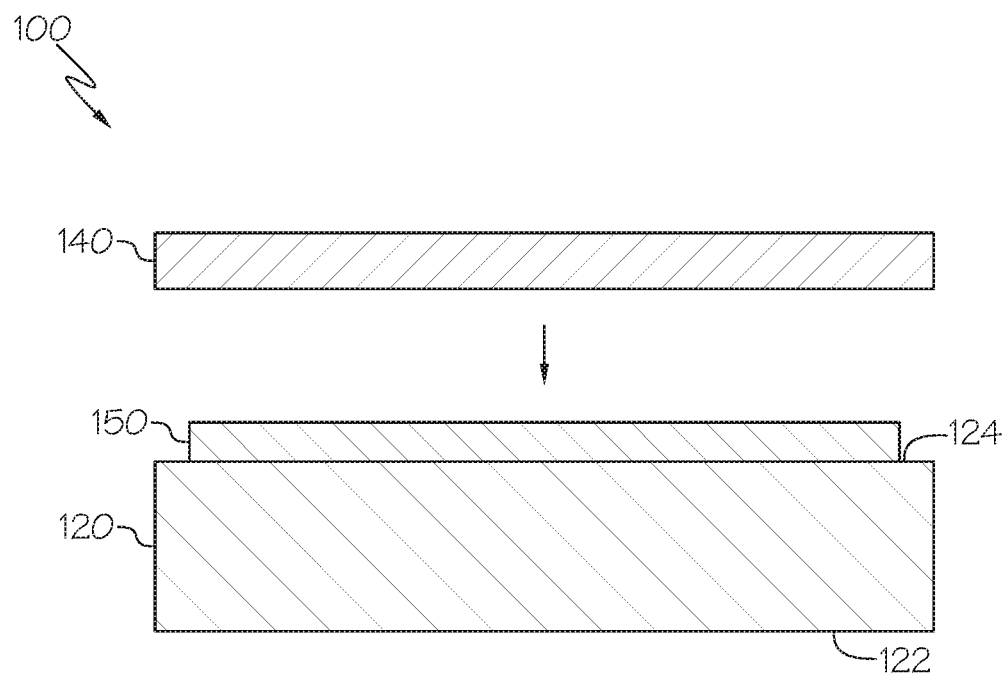
FIG. 4A schematically depicts a cross-sectional view of the fabrication of the assembly of FIG. 1 with a stress mitigation layer deposited onto platinum according to one or more embodiments shown and described herein.
Figure 4B:
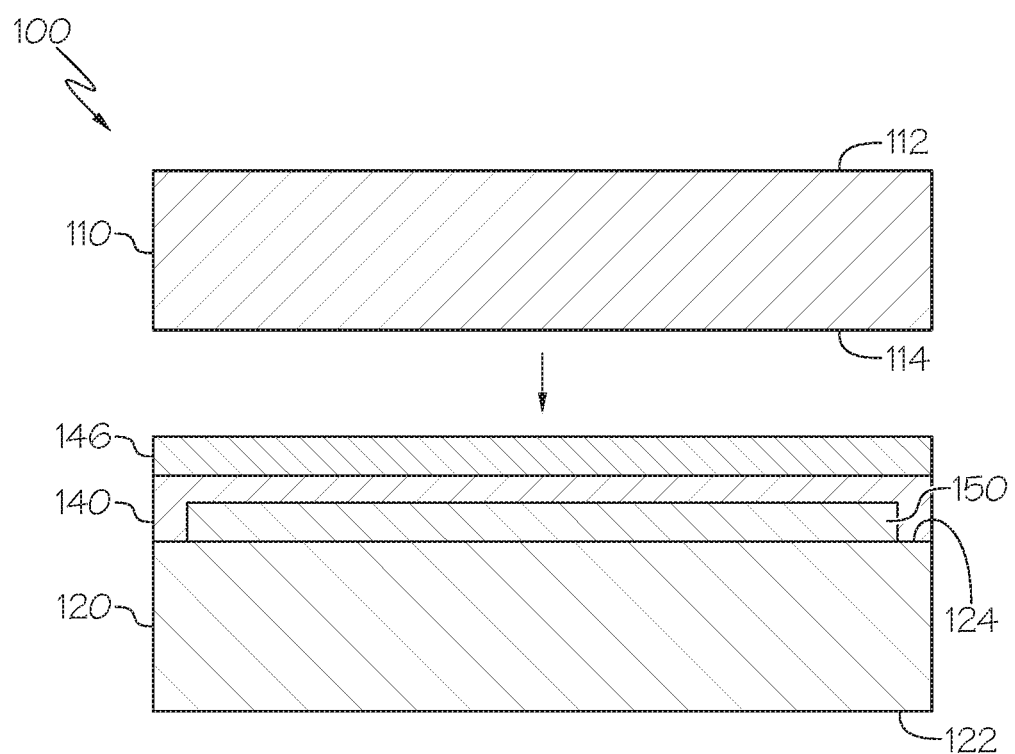
FIG. 4B schematically depicts a cross-sectional view of the fabrication of the assembly of FIG. 1 with platinum deposited over the stress mitigation layer such that the stress mitigation layer is encapsulated by platinum according to one or more embodiments shown and described herein.

Referring now to the flow chart of FIG. 3, a process 200 for forming the assembly 100 with the encapsulating stress mitigation layer 150 described above is shown. It should be understood that process 200 is merely illustrative and that the assembly 100 may be formed in various other methods. Initially at step 202, a phase change material (i.e., stress mitigation layer 150) is deposited onto the second substrate 120, and in particular, the stress mitigation layer 150 may be electroplated or electrodeposited along an interface 124 of the second substrate 120 such that it is securely disposed against the second substrate 120, as seen in FIG. 4A. At step 204, an encapsulating layer 140 (e.g., platinum) is deposited onto the stress mitigation layer 150 opposite of the second substrate 120, and in particular, the encapsulating layer 140 may be sputtered or electroplated onto the stress mitigation layer 150. In some embodiments, the encapsulating layer 140 may be a film that is placed on the stress mitigation layer 150 and extends around the stress mitigation layer 150 to secure the stress mitigation layer 150 to the second substrate 120. In this instance, with the encapsulating layer 140 extending around the stress mitigation layer 150, at least a portion of the encapsulating layer 140 is plated over the interface 124 of the second substrate, thereby encapsulating the stress mitigation layer 150 between the encapsulating layer 140 and the second substrate 120, as seen in FIG. 4B.

It should be understood that the encapsulating layer 140 is a high melting temperature material relative to the low melting temperature material of the stress mitigation layer 150 encapsulated therein. By way of example only, the low melting temperature material of the stress mitigation layer 150 (i.e., the phase change material) may comprise tin, bismuth, indium, and the like. At step 206, a low melting temperature material layer 146 (e.g., tin, bismuth, indium) is disposed over the encapsulating layer 140, as seen in FIG. 4B. In particular, the low melting temperature material layer 146 is plated along the top interface 142 of the encapsulating layer 140, opposite of a bottom interface 144 that is deposited against the stress mitigation layer 150. Additionally, in some embodiments an optional high melting temperature material layer may further be disposed over the low melting temperature material 146 such that the low melting temperature material 146 is positioned between the encapsulating layer 140 and the additional high melting temperature material layer prior to the assembly of the first substrate 110 onto the assembly 100. It should be understood that in other embodiments the optional high melting temperature material layer is omitted in the assembly 100 such that the low melting temperature material 146 is directly disposed against the interface 114 of the first substrate 110. As further described herein, in this instance the first substrate 110 may be coated with a high melting temperature material (e.g., a metal or metal alloy) along the interface 114 of the first substrate 110.

At step 208, an additional high melting temperature material is provided as a layer over the low melting temperature material layer 146. In particular, the first substrate 110 is disposed onto the low melting temperature material layer 146 along a top interface of the low melting temperature material layer 146 that is opposite of a bottom interface of the low melting temperature material layer 146, which is deposited against the top surface 142 of the encapsulating layer 140. Accordingly, the interface 114 of the first substrate 110 is disposed onto the low melting temperature material layer 146, further encapsulating the low melting temperature material of the stress mitigation layer 150 within the assembly 100. As briefly described above, it should be understood that in embodiments the interface 114 of the first substrate 110 may be coated with a metal or metal alloy layer or particles having a high melting temperature material used in TLP bonding processes. For example, the high melting temperature material coated along the interface 114 of the first substrate 110 may be copper, nickel, and/or the like. It should be understood that the low melting temperature material layer 146 may be provided in particles such that the low melting temperature material layer 146 is the shell and the high melting temperature material is the core.

At step 210, the assembly of the high melting temperature materials and the low melting temperature materials disposed between the substrates 110, 120 undergoes TLP bonding to thereby bond the first substrate 110 to the second substrate 120 with the bonding structure 128 disposed therein. During the TLP bonding process, the assembly 100 is heated to a sintering temperature (e.g., about 280° Celsius to about 300° Celsius) which causes edge portions of the low melting temperature material layer 146 to melt in response. An element of the low melting temperature material layer 146 (i.e., a constituent of an alloy of the low melting temperature material layer 146) is partially diffused into the adjacent high melting temperature materials of the first substrate 110 and the encapsulating layer 140. In this instance, intermetallic bonds occur between the material of the low melting temperature material layer 146 with the material of the first substrate 110 and the material of the encapsulating layer 140, thereby forming an intermetallic compound layer 130 (i.e., a bond layer) extending between the first substrate 110 and the encapsulating layer 140 (FIG. 1). The intermetallic compound layer 130 is formed as a result of the homogenization of an interface region between the low melting temperature material layer 146 with the interface 114 of the first substrate 110 and the top surface 142 of the encapsulating layer 140.

The intermetallic compound bond formed between the first substrate 110 and the encapsulating layer 140 has a re-melting temperature that is greater than the sintering temperature. Accordingly, the intermetallic compound layer 130 comprises a thermally conductive interface layer. In some embodiments, the assembly 100 may include a feature or fixture that is sized and configured to maintain the encapsulating layer 140 therein during the TLP bonding process. In this instance, the fixture inhibits the encapsulating layer 140, and in particular the stress mitigation layer 150, from leaking out of the assembly 100 as the first substrate 110 is bonded to the second substrate 120 at the TLP sintering temperatures with the encapsulating layer 140 and the stress mitigation layer 150 disposed therebetween.

It should be understood that the encapsulating layer 140 comprises a thickness that is sufficiently sized to maintain a layer of material (e.g., platinum) within the assembly 100, and encapsulating the stress mitigation layer 150 disposed therein, after a portion of the encapsulating layer 140 diffuses into the adjacent first substrate 110 to form the intermetallic compound layer 130. Accordingly, the remaining layer of material of the encapsulating layer 140 disposed in the assembly 100 after the TLP bonding process is effectively an undiffused portion of the encapsulating layer 140. In other words, only a portion of the encapsulating layer 140 that is in direct contact with the interface 114 of the first substrate 110 is diffused into the first substrate 110 such that an undiffused portion of the encapsulating layer 140 remains disposed therein. It should further be understood that the bonding structure 128 of the assembly 100 may include additional intermetallic compound layers 130 and/or encapsulating layers 140 therein, as described below. Additionally, it should be understood that in some embodiments the encapsulating layer 140 may be plated with a thin material layer along at least the interface 142 such that the material layer is in direct contact with the first substrate 110. In this instance, the material layer is diffused into the first substrate 110 to form the intermetallic compound layer 130 formed therebetween, rather than a portion of the encapsulating layer 140 being diffused into the first substrate 110. By way of example only, the thin material layer may be formed of tin (Sn), copper (Cu), nickel (Ni), platinum (Pt), and the like.

At step 212, the assembly 100 is cooled to thereby solidify the bonds between the high melting temperature materials and the low melting temperature materials of the assembly 100, and in particular, the first substrate 110, the second substrate 120, and the encapsulating layer 140. Upon cooling the assembly 100, the intermetallic compound layer 130 is solidified by virtue of isothermal solidification. As described above, the intermetallic compound layer 130 has a high re-melting temperature relative to the melting temperature of the encapsulating layer 140, and in particular the lower melting temperature of the stress mitigation layer 150 that remains disposed within the assembly 100. Accordingly, the intermetallic compound layer 130 remains in solid form at the melting temperature of the encapsulating layer 140, and also at a lower melting temperature of the stress mitigation layer 150 encapsulated between the encapsulating layer 140 and the second substrate 120. As described in greater detail herein, in use the stress mitigation layer 150 transitions to a liquid form when the assembly 100 operates at or above the low melting temperature of the low melting temperature material of the stress mitigation layer 150.

The encapsulating layer 140 and the second substrate 120 maintain the stress mitigation layer 150 encapsulated therein between the interface 144 of the encapsulating layer 140 and the interface 124 of the second substrate 120 after the bonding process. At least a remaining thickness of the encapsulating layer 140 is exposed around the stress mitigation layer 150 to seal the stress mitigation layer 150 against the second substrate 120 the assembly 100. As described above, the encapsulating layer 140 may have a higher melting temperature relative to the low melting temperature of the stress mitigation layer 150 (i.e., material capable of withstanding an operating temperature of about 156° Celsius). For example, the melting temperature material of the encapsulating layer 140 may comprise platinum, copper, high purity aluminum, and/or the like. With the encapsulating layer 140 being formed of a higher melting temperature material relative to the low melting temperature material of the stress mitigation layer 150, the encapsulating layer 140 is configured to withstand the operating temperatures of the assembly 100 (e.g., about 156° Celsius) and remain intact to encapsulate the stress mitigation layer 150 against the second substrate 120 when the low melting temperature material of the stress mitigation layer 150 transitions to a liquid.

It should be understood that other configurations and examples of the arrangement of the assembly 100 may be used to provide the stress mitigation characteristics of the encapsulating layer 140 and the stress mitigation layer 150 described above. For example, as noted below, the assembly may include bonding structures that comprise more or fewer stress mitigation layers encapsulated within encapsulating layers and/or intermetallic compound layers, such as the assemblies 300, 400, 500, 600 described herein.

A non-limiting example of a method for using the assembly 100 may include initiating electrical communication through the assembly 100 while the assembly 100 (e.g., a power electronics assembly) is utilized in an electrical application. For example, an electrical application of the assembly 100 may include inverter systems for hybrid vehicles and electric vehicles. In this instance, the assembly 100 is subjected to an operating temperature that approaches or exceeds 200° Celsius.

In this instance, the first substrate 110 (e.g., a power semiconductor device) generates thermal energy, which is imparted on the assembly 100. Accordingly, thermally induced stresses are generated by the first substrate 110 such that the assembly 100 endures thermomechanical stresses therein. The intermetallic compound layer 130 and the second substrate 120 may have varying coefficients of thermal expansion (CTE) such that each component of the assembly 100 may experience expansion and/or contraction at various rates and extents as the assembly 100 operates. Accordingly, with the presence of a solid TLP interlayer having a high melting temperature disposed within the assembly 100, the components of the assembly 100 may experience cracking due to the thermal expansion of the intermetallic compound layer 130 and/or the second substrate 120. Further, TLP intermetallic compound layers may be brittle, and thus may easily crack within the assembly 100.

As the temperature of the assembly 100 rises during operation, the stress mitigation layer 150 remains in a solid form between the encapsulating layer 140 and the second substrate 120 while the temperature remains below the low melting temperature of the material of the stress mitigation layer 150. In the present example, the low melting temperature of the stress mitigation layer 150 may be about 156° Celsius such that exceeding a temperature threshold of about 230° Celsius causes the stress mitigation layer 150 to melt from the solid form into a liquid form. It should be understood that the low melting temperature of the stress mitigation layer 150 may vary depending on the type of material that the stress mitigation layer 150 is composed of.

With the stress mitigation layer 150 now in a liquefied form, the thickness of the material of the encapsulating layer 140 disposed about the stress mitigation layer 150 and the interface 124 of the second substrate 120 serve to maintain the liquefied stress mitigation layer 150 within the assembly 100. In particular, the encapsulating layer 140 seals the liquid of the stress mitigation layer 150 against the second substrate 120 such that the liquid is encapsulated therein and inhibited from leaking out of the assembly 100.

As the assembly 100 continues to be utilized in the high-power electrical application, the first substrate 110 continues to generate thermal energy within the assembly 100, which thereby continues to impart thermally induced stresses onto the assembly 100. However, with the stress mitigation layer 150 transitioned into the liquefied form, the liquid encapsulated between the encapsulating layer 140 and the second substrate 120 aids in mitigating and/or inhibiting the thermomechanical stresses endured by the assembly 100, and in particular, by the first substrate 110 and/or the second substrate 120. The liquid disposed within the encapsulating layer 140 and the second substrate 120 provides a softer material disposed between the first substrate 110 and the second substrate 120, as compared to a solid interlayer (e.g., TLP interlayer), such that the liquefied stress mitigation layer 150 is capable of absorbing the thermomechanical stresses generated within the assembly 100.

In this instance, the assembly 100 exhibits enhanced stress mitigation characteristics while the assembly 100 operates at elevated temperatures of about 156° Celsius or greater. Ultimately, the presence of a liquefied stress mitigation layer 150 encapsulated between the encapsulating layer 140 and the second substrate 120 as the assembly 100 operates at temperatures exceeding the low melting temperature threshold may contribute toward an increased life expectancy for the assembly 100. In instances where the assembly 100 operates at reduced temperatures of about 155° Celsius or less, the stress mitigation layer 150 may still contribute toward reducing thermomechanical stresses of the assembly 100 as the first substrate 110 is in operation due to the low stiffness grade of the stress mitigation layer 150. Additionally, the phase change process of the stress mitigation layer 150 further provides a thermal buffer that reduces supplementary cooling needs from an external system. Accordingly, with the inclusion of a phase change material (i.e., stress mitigation layer 150) between the encapsulating layer 140 and the second substrate 120, the assembly 100 is effectively able to maintain a lower transient-temperature once the operating temperature of the assembly 100 exceeds the melting temperature of the stress mitigation layer 150.

Figure 5:
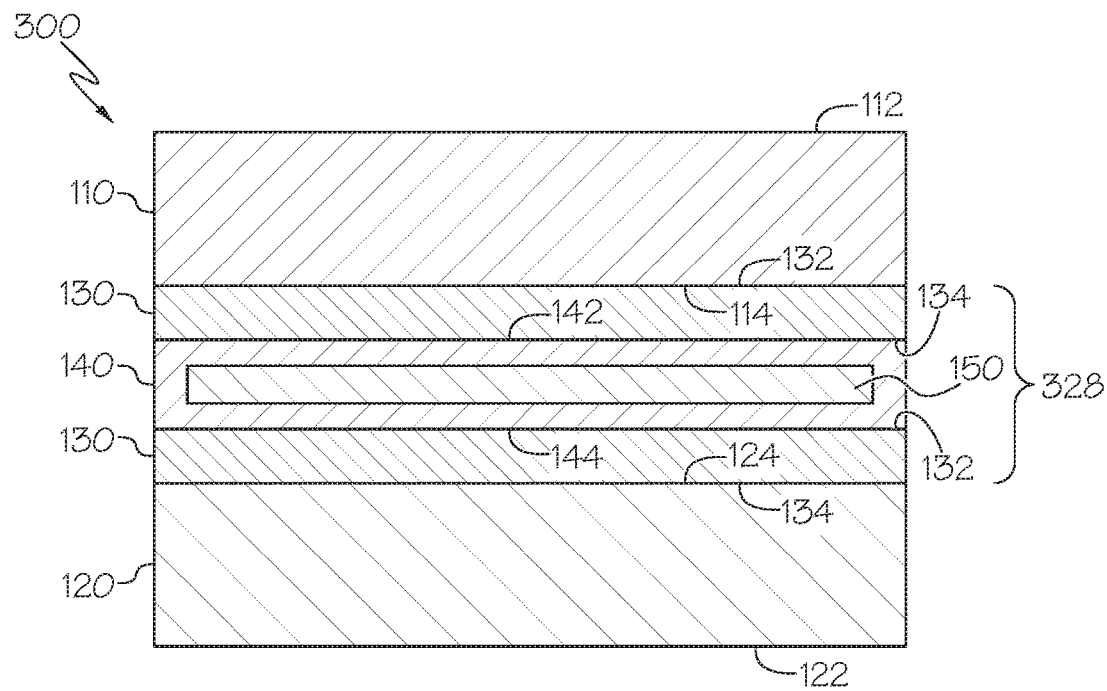
FIG. 5 schematically depicts a cross-sectional view of another assembly having a pair of substrates bonded to one another by a bonding structure including an encapsulated stress mitigation layer according to one or more embodiments shown and described herein.

As briefly described above, in some embodiments the bonding structure 128 of the assembly 100 may include more or fewer encapsulating layers 140 and/or intermetallic compound layers 130 disposed between the first substrate 110 and the second substrate 120. Referring now to FIG. 5, another non-limiting example of an assembly 300 (e.g., a power electronics assembly) is schematically illustrated. Except for the differences explicitly noted herein, it should be understood that the assembly 300 is similar to the assembly 100 described above such that the assembly 300 may be configured and operable just like the assembly 100. Therefore, identical or substantially similar components are marked with the same reference numerals, without further discussion. It should be understood that any components and operabilities of the assembly 300 that are not explicitly described below may be the same as the components and operabilities of the assembly 100 described above.

The assembly 300 comprises the first substrate 110 bonded to the second substrate 120 by a bonding structure 328 disposed therebetween. The bonding structure 328 comprises a pair of intermetallic compound layers 130 and an encapsulating layer 140. The encapsulating layer 140 is separated from contacting the first substrate 110 and the second substrate 120 by at least one of the pair of intermetallic compound layers 130. Accordingly, the stress mitigation layer 150 encapsulated within the encapsulating layer 140 is isolated and offset from the substrates 110, 120 by a remaining thickness of the encapsulating layer 140, after the TLP bonding process, and the intermetallic compound layers 130 disposed therebetween. It should be understood that, in many respects, the assembly 300 is fabricated and functions substantially similar to the assembly 100. In particular, during the TLP bonding process, the pair of intermetallic compound layers 130 are formed along both interfaces 142, 144 of the encapsulating layer 140 as the portions of the encapsulating layer 140 along the interfaces 142, 144 become partially diffused into the substrates 110, 120. Accordingly, two intermetallic compound layers 130 are formed between each of the first substrate 110 and the second substrate 120, and the remaining, undiffused portion of the encapsulating layer 140.

It should be understood that the encapsulating layer 140 is a separate and distinct layer disposed within the assembly 300 relative to the intermetallic compound layers 130 and the stress mitigation layer 150, such that the encapsulating layer 140 is individually deposited into the assembly 300 after the stress mitigation layer 150 is directly plated onto the second substrate 120 along the interface 124. In this instance, with the stress mitigation layer 150 plated onto the second substrate 120, the encapsulating layer 140 is thereafter deposited atop the stress mitigation layer 150 to encapsulate the stress mitigation layer 150 to the assembly 300.

Figure 6:
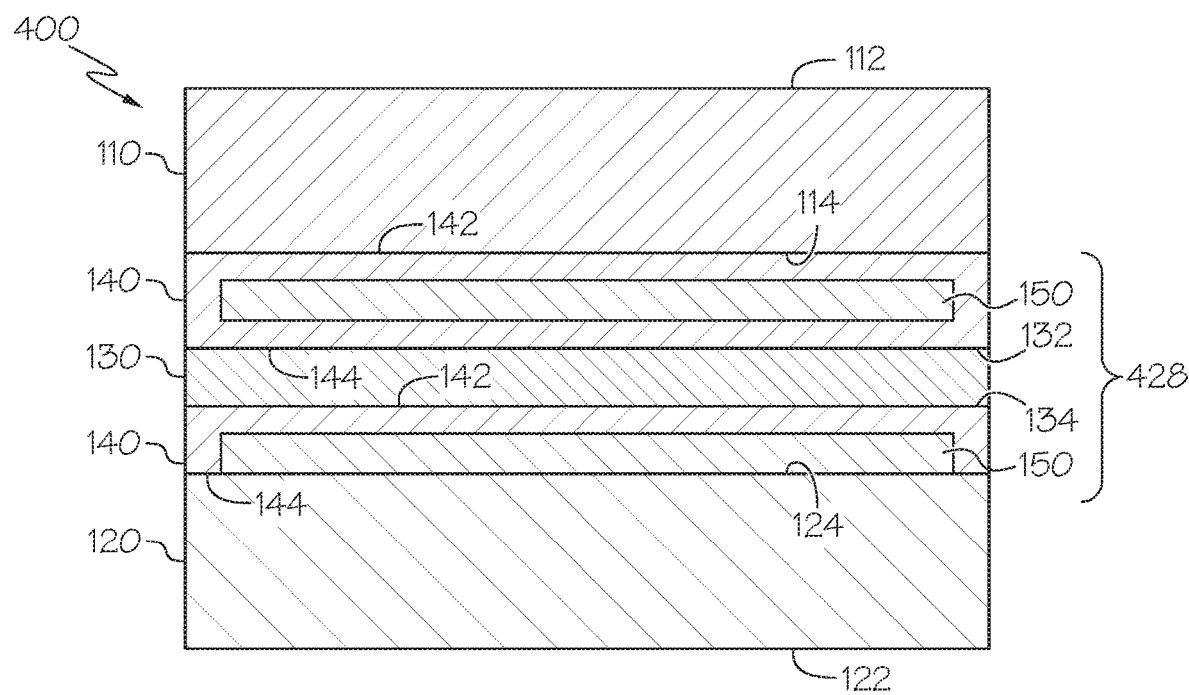
FIG. 6 schematically depicts a cross-sectional view of another assembly having a pair of substrates bonded to one another by a bonding structure including a pair of encapsulated stress mitigation layers according to one or more embodiments shown and described herein.

Referring now to FIG. 6, another non-limiting example of an assembly 400 (e.g., a power electronics assembly) that is similar to the assemblies 100, 300 described above is schematically illustrated. It should be understood that the assembly 400 may be configured and operable just like the assemblies 100, 300, therefore, similar components are marked with the same reference numerals. It should be understood that any components and operabilities of the assembly 400 that are not described explicitly below may be the same as the components and operabilities of the assemblies 100, 300 described above.

The assembly 400 comprises the first substrate 110 bonded to the second substrate 120 by a bonding structure 428 disposed therebetween. The bonding structure 428 comprises a pair of encapsulating layers 140 and an intermetallic compound layer 130. The pair of encapsulating layers 140 is separated from contacting one another by the intermetallic compound layer 130 disposed therebetween. Accordingly, the pair of encapsulating layers 140 is each directly bonded to one of the first and second substrates 110, 120 such that the intermetallic compound layer 130 is isolated from contacting either of the substrates 110, 120. In this instance, the assembly 300 includes a stress mitigation layer 150 extending within each of the pair of encapsulating layers 140 of the assembly 300. Similar to the assembly 100, at least one of the stress mitigation layers 150 is directly plated (e.g., electroplated) onto the interface 124 of the second substrate 120. It should be understood that, in many respects, the assembly 300 is fabricated and functions substantially similar to the assembly 100. In this instance, an encapsulating layer 140 is directly deposited (e.g., by electroplating) onto each of the first substrate 110 and the second substrate 120 such that the pair of encapsulating layers 140 is disposed against one another prior to bonding. Accordingly, during the TLP bonding process, the intermetallic compound layer 130 is formed between the pair of encapsulating layers 140 in a substantially similar manner as described above with respect to process 200 (FIG. 3). It should be understood that in the present example, the encapsulating layer 140 of the assembly 300 may include an initial thickness of material that is greater than the encapsulating layer of the assembly 100 described above.

Figure 7:
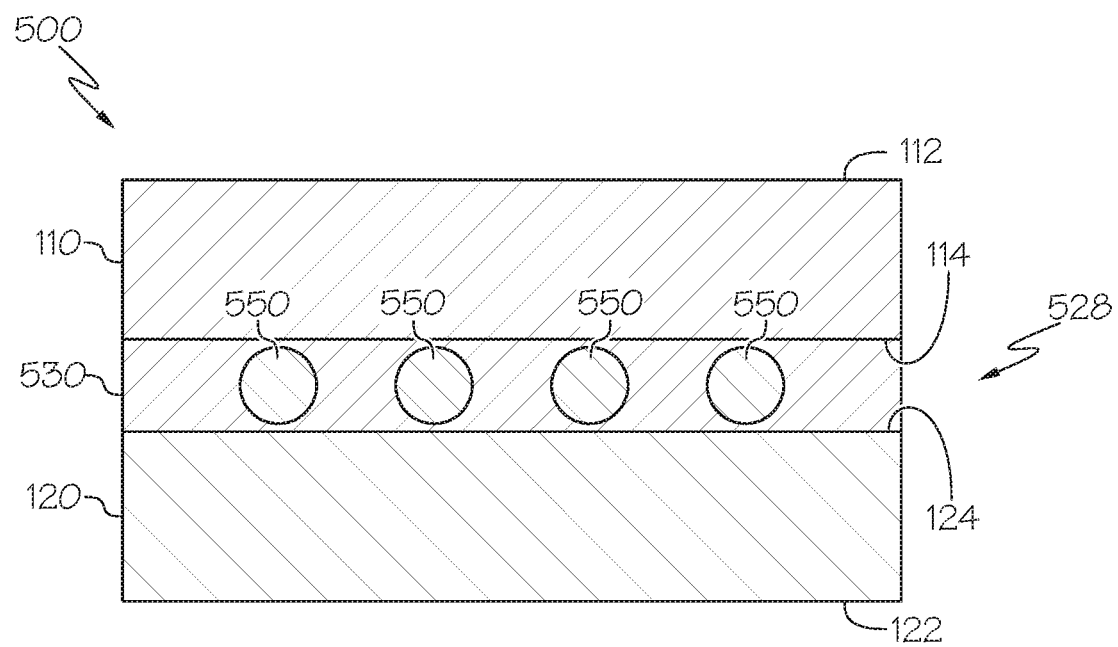
FIG. 7 schematically depicts a cross-sectional view of another assembly having a pair of substrates bonded to one another by a bonding structure including an intermetallic compound layer encapsulating a stress mitigation layer according to one or more embodiments shown and described herein.

Referring now to FIG. 7, a non-limiting example of another assembly 500 (e.g., a power electronics assembly) is schematically illustrated. Similar to the assemblies 100, 300, 400 described above, the assembly 500 includes a first substrate 110 and a second substrate 120 bonded to one another by a bonding structure 528 comprising at least one intermetallic compound layer 530 disposed therebetween. Except for the differences explicitly noted herein, the assembly 500 may be configured and operable just like the assemblies 100, 300, 400 such that substantially similar components are marked with the same reference numerals. It should be understood that any components and operabilities of the assembly 500 that are not described explicitly below may be the same as the components and operabilities of the assemblies 100, 300, 400 described above.

Unlike the assemblies 100, 300, 400 described above, the bonding structure 528 of the assembly 500 does not include an encapsulating layer disposed therein. Rather, the bonding structure 528 comprises an intermetallic compound layer 530 directly bonded to the interfaces 114, 124 of both the first substrate 110 and the second substrate 120, respectively. Accordingly, the first substrate 110 is separated from contacting the second substrate 120 solely by the intermetallic compound layer 530 disposed therebetween. In this instance, the assembly 500 includes a stress mitigation layer 550 encapsulated within the intermetallic compound layer 130. Accordingly, the stress mitigation layer 550 is directly deposited onto each of the substrates 110, 120 due to the direct bond of the intermetallic compound layer 530 with both the first substrate 110 and the second substrate 120. In the present example, the stress mitigation layer 550 comprises a plurality of circularly shaped material (i.e., phase change material) disposed within the intermetallic compound layer 530. The plurality of circularly shaped stress mitigation layers 550 are positioned throughout a length of the intermetallic compound layer 530 at substantially equal intervals. It should be understood that in other embodiments the stress mitigation layer 550 may comprise various other shapes and be positioned throughout the intermetallic compound layer 530 at varying distance intervals than that shown and described herein.

Prior to the assembly 500 undergoing the TLP bonding process, it should be understood that the phase change material of the stress mitigation layer 550 comprises a plurality of particles that are interchangeably disposed with a plurality of solder particles that ultimately form the intermetallic compound layer 530. Accordingly, the plurality of circularly shaped stress mitigation layers 550 shown and described above are formed as a result of the TLP bonding process, which provides for the plurality of phase change material particles to assemble together in response to the assembly 500 being exposed to the TLP sintering temperatures that form the intermetallic compound layer 530. In some embodiments, it should be understood that the assembly 500 is configured to undergo a powder-based TLP bonding process in lieu of a foil-based TLP bonding process.

It should be understood that, in many respects, the assembly 500 is fabricated and functions substantially similar to the assembly 100 described above. For example, the assembly 500 may be fabricated by depositing a metallic interlayer along the interface 124 of the second substrate 120 such that the second substrate 120 is plated with the metallic interlayer. Similar to the process 200 described above, the metallic interlayer may formed of platinum. It should be understood that the in some embodiments the metallic interlayer may be a thin film layer positioned over the substrate 120 and/or metallic particles. The phase change material is deposited onto the metallic interlayer and is thereafter encapsulated by another metallic interlayer (e.g., platinum) positioned over the phase change material such that the phase change material is encapsulated between metallic interlayers. The metallic interlayers are formed of a low melting temperature material, relative to the high melting temperature material of the substrates 110, 120, such that the interlayers are configured to melt and diffuse into the first substrate 110 and the second substrate at the TLP sintering temperatures (e.g., about 280° Celsius to about 300° Celsius.

Similar to the assembly 100, the phase change material is a stress mitigation layer 150 comprising indium, tin, bismuth, and the like. Dissimilar to the assembly 100 and the process 200 described above, the metallic interlayers do not have a thickness that is sufficiently sized to maintain a distinct, platinum layer remaining within the assembly 500 and that encapsulates the stress mitigation layer 150 after the TLP bonding process of the assembly 500. In the present example, the metallic interlayers are entirely diffused into the adjacent substrates 110, 120 such that the assembly 500 does not include an undiffused portion of a metallic layer (e.g., platinum layer). Rather, an intermetallic compound layer 530 is formed within the assembly 500 and disposed between the substrates 110, 120, with the stress mitigation layer 150 effectively encapsulated within the intermetallic compound layer 530.

Figure 8:
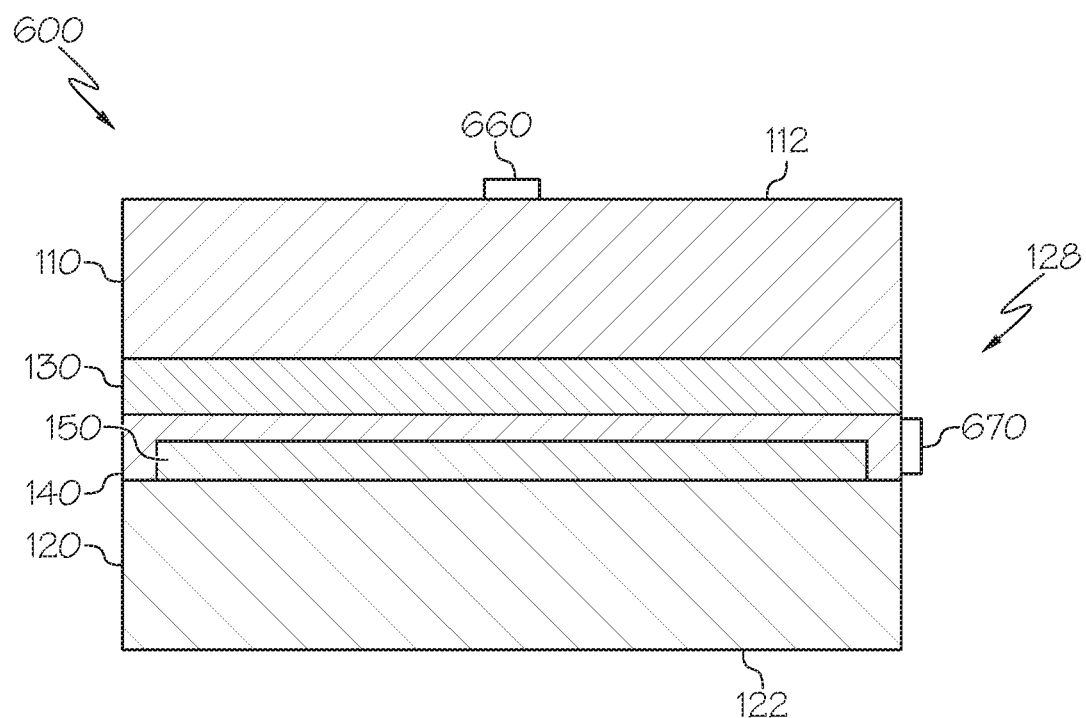
FIG. 8 schematically depicts a cross-sectional view of another assembly having a pair of sensors according to one or more embodiments shown and described herein.

Referring now to FIG. 8, a non-limiting example of an assembly 600 (e.g., a power electronics assembly) is schematically illustrated that includes a pair of devices 660, 670. Except for the differences explicitly noted herein, it should be understood that the assembly 600 is similar to the assembly described above such that the assembly 600 may be configured and operable just like the assembly 100. Accordingly, identical components are marked with the same reference numerals. It should be understood that any components and operabilities of the assembly 600 that are not explicitly described below may be the same as the components and operabilities of the assembly 100 described above.

The assembly described herein includes devices positioned along various components of the assembly, and in particular, assembled onto a substrate (e.g., semiconductor device) and a platinum layer of the assembly. The devices may be configured to detect and measure a temperature and/or a resistance of the components that the devices are directly bonded to, respectively, for purposes of predicting a failure of the assembly due to thermomechanical stresses endured by the assembly during operation. Monitoring the thermomechanical stresses of the assembly throughout its operation may allow an operator to identify with accuracy when a failure may occur.

In the present example, the assembly 600 includes a first device 660 positioned along the outer-face 112 of the first substrate 110 and a second device 670 positioned along the encapsulating layer 140. In particular, the first device 660 is a temperature sensor that is bonded directly to the outer-face 112 of the first substrate 110 and is configured to detect a temperature of the first substrate 110. The second device 670 is a resistance sensor positioned onto the encapsulating layer 140. It should be understood that although the second device 670 is depicted as being bonded to a side portion of the encapsulating layer 140, the second device 670 may be bonded to the encapsulating layer 140 along various areas of the encapsulating layer 140. For example, the second device 670 may be bonded to an opposing side portion of the encapsulating layer 140 than the side portion of the encapsulating layer 140 depicted in FIG. 8.

Platinum has a linear relationship between temperature and resistance such that identifying a resistance of platinum may be an accurate basis for determining the temperature of the material. In the present example, determining a thermal resistance of the assembly 600 may be desirable for various purposes, including but not limited to, predicting a failure of the assembly 600 caused by the thermomechanical stresses endured by the assembly 600 during operation. Accordingly, the first device 660 serves as temperature detector that may be repeatedly utilized to detect a current temperature of the first substrate 110, and the second device 670 serves as a resistance detector that may be utilized to detect a current resistance endured at the encapsulating layer 140, which in the present example is formed of platinum. As described in more detail herein, by obtaining the temperature of the first substrate 110 and the resistance at the encapsulating layer 140, a thermal resistance of the assembly 600 may be determined.

In use, a temperature of the first substrate 110 and a resistance of the platinum encapsulating layer 140 are detected by the first device 660 and the second device 670, respectively, during operation of the assembly 600. As heat is applied onto the first substrate 110 during operation of the assembly 600, a temperature of the first substrate 110 and a resistance at the encapsulating layer 140 may increase accordingly. With the resistance at the platinum encapsulating layer 140 identified, an inner temperature of the assembly 600 from where the platinum encapsulating layer 140 is positioned may be determined due to the linear relationship of temperature and resistance as described above. Once an inner temperature of the assembly 600 is determined, a delta temperature of the assembly 600 is identified by determining a difference between the temperature of the first substrate 110 and the temperature of the encapsulating layer 140.

Thereafter, the thermal resistance of the assembly 600 may be determined in accordance with the delta temperature value. By monitoring the thermomechanical stresses of the assembly 600 as the assembly 600 is in active operation, an operator may effectively anticipate when a failure of the assembly 600 may occur with great accuracy. In other words, the thermal resistance computed may be utilized as a metric for predicting the failure of the assembly 600 caused by thermal mechanical stresses.

Figure 9:
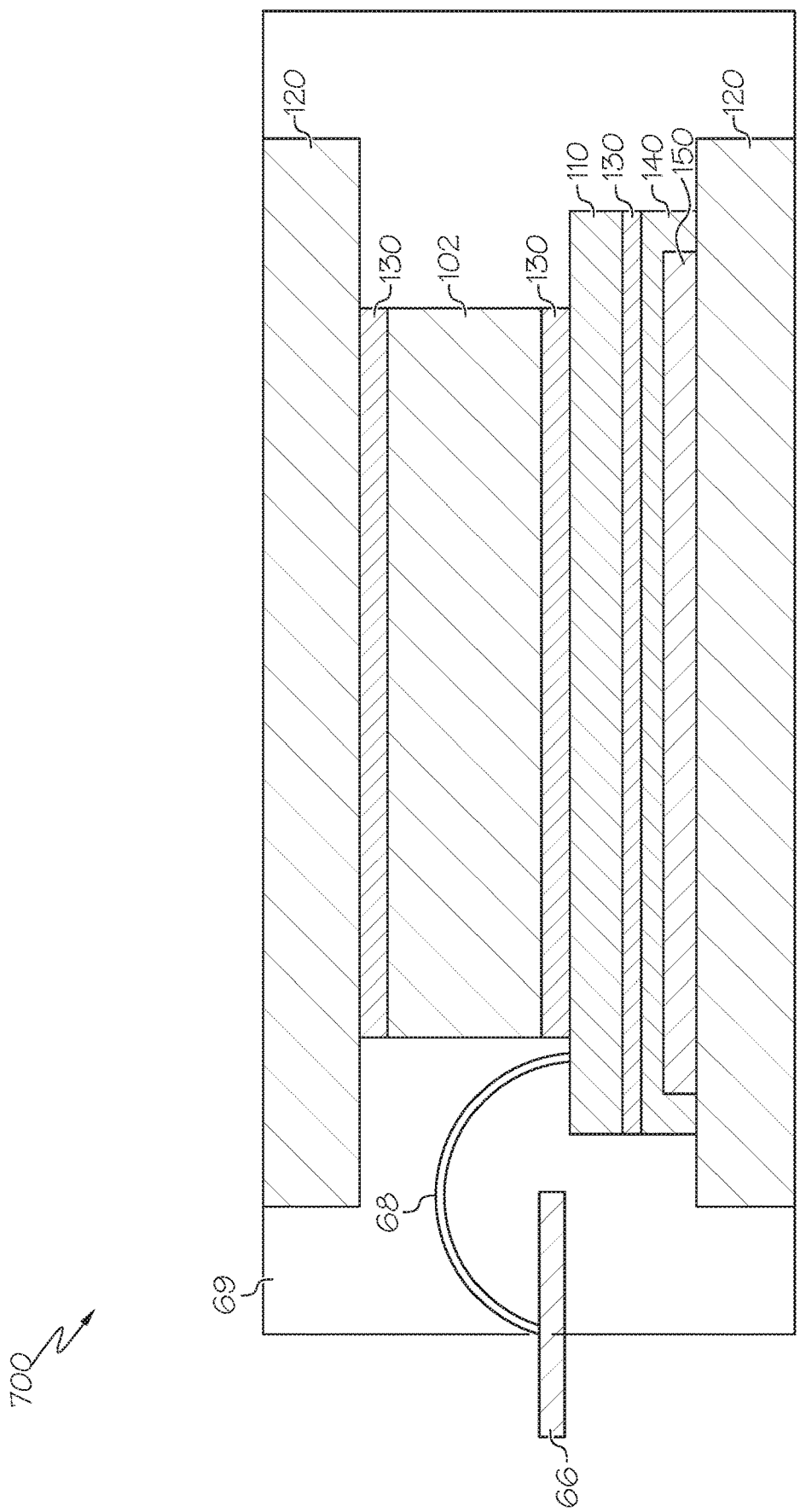
FIG. 9 schematically depicts a cross-sectional view of another assembly forming a double-sided cooling structure according to one or more embodiments shown and described herein.

Referring now to FIG. 9, a non-limiting example of an assembly 700 (e.g., a power electronics assembly) is schematically illustrated having a double-sided cooling of the first substrate 110 (e.g., power electronic device). Except for the differences explicitly noted herein, it should be understood that the assembly 700 is similar to the assembly described above such that the assembly 700 may be configured and operable just like the assembly 100. Accordingly, identical components are marked with the same reference numerals. It should be understood that any components and operabilities of the assembly 700 that are not explicitly described below may be the same as the components and operabilities of the assembly 100 described above.

The assembly 700 described herein may include at least one first substrate 110 within a stack of thermally coupled components. The first substrate 110 may form one or more layers positioned between one or more additional layers that include substrates, bond layers, spacer layers, and/or the like. For example, the assembly 700 may include a pair of second substrates 120 disposed about opposing ends of the assembly 700 with the first substrate 110 disposed therein. In particular, the stress mitigation layer 150 is deposited (e.g., electrodeposited) along the interface 124 of the at least one of the pair of second substrates 120, with the encapsulating layer 140 disposed about the stress mitigation layer 150 thereby encapsulating the stress mitigation layer 150 between the second substrate 120 and the encapsulating layer 140. The first substrate 110 bonded to the encapsulating layer 140 with an intermetallic compound layer 130 disposed therebetween. The intermetallic compound layer 130 is formed between the first substrate 110 and the encapsulating layer 140 in response to the first substrate 110 being transient liquid phase (TLP) bonded to the second substrate 120 as described in detail above. It should be understood that a low melting temperature material (e.g., low melting temperature material 146) positioned between the first substrate 110 and the encapsulating layer 140 is melted and diffused into the adjacent layers, as previously described above, to thereby form the intermetallic compound layer 130 in response to the assembly 700 undergoing TLP bonding.

The first substrate 110 is further bonded to a spacer layer 102, along an outer-face 112 of the first substrate 110 which is opposite of the interface 114 that is bonded to the encapsulating layer 140, via the intermetallic compound layer 130 disposed therebetween. Similarly, an intermetallic compound layer 130 is disposed between the first substrate 110 and the spacer 102 as a result of the first substrate 110 undergoing TLP bonding with the spacer layer 102 with a low melting temperature material disposed therebetween. In this instance, the first substrate 110 is disposed between a pair of intermetallic compound layers 130, respectively. Another of the pair of second substrates 120 disposed within the assembly 700 is deposited onto a top surface of the spacer layer 102, opposite of the bottom surface that is bonded to the first substrate 110. In this instance, the second substrate 120 is bonded thereto via an intermetallic compound layer 130.

The spacer layer 102 may include a spacer material that is capable of electric and thermal conduction, such as but not limited to, copper, aluminum, nickel, gallium, or any other metal, alloy, or compound that is capable of electrical and/or thermal conduction. It should be understood that the spacer 102 is sized and shaped to accommodate for the attachment of a wire 68 to the first substrate 110 (e.g. power electronic device) of the assembly 700. In this instance, the spacer 102 is configured to provide a clearance between the first substrate 110 and the second substrate 120 to thereby expose a portion (e.g., outer-face 112) of the first substrate 110 for connection with the wire 68.

The pair of second substrates 120 may be a thermally conductive metal, a semiconductor material, an electrode, and/or the like. In some embodiments, one of the pair of second substrates 120 may be a collector terminal of the assembly 700 (e.g., power electronic assembly) and the other of the pair of second substrates 120 may be an emitter terminal of the assembly 700. In some embodiments, the assembly 700 may be thermally coupled to a cooling structure (not shown) along the outer surfaces of the assembly 700, and in particular, at the pair of second substrates 120. The cooling structure may be a fluid cooler, heat sink, heat exchanger, vapor chamber, liquid-phase cooling apparatus, either active (e.g., utilizing jet channels and pumps), passive (e.g., utilizing thermal convection, conduction, radiation, including processes such as nucleation or the like), or a combination of both, or other cooling structure capable of removing heat from the assembly 700. In some embodiments, the cooling structure may include an air-cooled heat sink or a liquid-cooled heat sink, such as a jet impingement or channel-based heat sink device. Additionally or alternatively, the pair of second substrates 120 of the assembly 700 may further include a thermal grease coating disposed along surfaces of the each of the second substrates 120. In some embodiments, the second substrate 120 may be directly bonded to the cooling structure using a variety of bonding techniques, such as but not limited to TLP sintering, solder, brazing, or diffusion bonding, for example.

To compensate for increased thermal stresses endured within the assembly 700, as caused by operation of the first substrate 110 (i.e., the power electronic device), the encapsulating layer 140 includes the stress mitigation layer 150 encapsulated therein. As described above, the stress mitigation layer 150 is formed of a phase change material that has a lower melting temperature relative to the encapsulating layer 140. Accordingly, the stress mitigation layer 150 may transition from a solid state to a liquid state in response to the temperature of the assembly 700 increasing beyond the melting point of the stress mitigation layer 150. The stress mitigation layer 150 may exhibit a reduced Young's modulus (e.g., reduced stiffness) when in the liquid state which may allow some flexibility in the encapsulating layer 140 to compensate for the thermal stresses during temperature cycling of the first substrate 110.

The assembly 700 may include a gate electrode 66 that is electrically coupled to the first substrate 110. In the present example, the gate electrode 66 is electrically coupled to the first substrate 110 (e.g., power electronic device) via the wire 68 that is secured to the outer-face 112 of the first substrate 110. It should be understood that in other embodiments the gate electrode 66 may be directly electrically coupled to the first substrate 110 such that the wire 68 is omitted. In some embodiments, a signal, such as a gate voltage, may be applied to the gate electrode 66 to cause the first substrate 110 to conduct such that the pair of second substrates 120 may be electrically coupled to one another. The assembly 700 may further include a resin 69 that is configured to provide a supporting structure or package to the components of the assembly 700. It should be understood that FIG. 9 depicts only one possible embodiment of an assembly 700 and should not be limited to such components and configuration.

As stated above, the assemblies 100, 300, 400, 500, 600, 700 described above may be incorporated into an inverter circuit or system that converts direct current electrical power into alternating current electrical power, and vice versa, depending on the particular application. Power semiconductor devices utilized in such vehicular applications may generate a significant amount of thermally induced stresses during operation thereby requiring cooling of the semiconductor devices. The encapsulating layer encapsulating a stress mitigation material described above and illustrated herein may be bonded to the assembly to mitigate the thermomechanical stresses generated by the semiconductor device to thereby cool the assembly while also providing a compact package design due to the reduction in metallic interlayers disposed therein.

It should now be understood that the stress mitigation layer in the assembly (e.g., power electronics assembly) and vehicles described herein may be utilized for mitigating thermally induced stresses endured by the assembly to cool the semiconductor devices, thereby providing a more compact package design. Particularly, the encapsulated stress mitigation layers may be bonded to substrates that generate thermomechanical stresses during operation and/or bonding, and the stress mitigation layer(s) are formed of low melting temperature materials that melt at low temperatures to thereby promote stress mitigating characteristics in the assembly.

It is noted that the term "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue. The terms "lower", "upper" and "middle" are used in relation to the figures and are not meant to define an exact orientation of 2-in-1 power electronics assemblies or layers used to form 2-in-1 electronic assemblies described herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. An assembly comprising:
   a first substrate;
   a second substrate;
   a bonding structure disposed between the first and the second substrates, wherein the bonding structure comprises:
     an intermetallic compound layer bonded to the first and the second substrate; and
     a stress mitigation layer encapsulated within the intermetallic compound layer, wherein the stress mitigation layer has a low melting temperature relative to a higher melting temperature of the intermetallic compound layer;
   wherein the stress mitigation layer is capable of melting into a liquid when the assembly operates at a temperature above the lower melting temperature of the stress mitigation layer and at least the intermetallic compound layer is capable of maintaining the liquid of the stress mitigation layer within the assembly.

2. The assembly of claim 1, wherein the low melting temperature of the stress mitigation layer is greater than or equal to 156 degrees Celsius.

3. The assembly of claim 1, wherein the higher melting temperature of the intermetallic compound layer is such that the intermetallic compound layer remains in solid form at the low melting temperature.

4. The assembly of claim 1, wherein the stress mitigation layer comprises indium or tin.

5. The assembly of claim 1, wherein the first substrate is a semiconductor device and the second substrate comprises copper or nickel.

6. The assembly of claim 1, wherein the intermetallic compound layer comprises platinum.

7. The assembly of claim 1, further comprising a plurality of stress mitigation layers encapsulated within the intermetallic compound layer.

8. The assembly of claim 7, wherein the plurality of stress mitigation layers are circularly shaped.

9. The assembly of claim 8, wherein the plurality of stress mitigation layers are positioned throughout a length of the intermetallic compound layer.

10. The assembly of claim 9, wherein the plurality of stress mitigation layers are positioned throughout the intermetallic compound layer at substantially equal intervals.

11. The assembly of claim 1, wherein the stress mitigation layer is configured to reduce thermomechanical stresses endured along the first substrate and the second substrate when the stress mitigation layer is melted into the liquid.

12. A power electronic assembly comprising:
a metal substrate having an interface;
a semiconductor device having a corresponding interface;
an intermetallic compound layer bonded to the interface of the semiconductor device and the interface of the metal substrate; and
a stress mitigation layer encapsulated within the intermetallic compound layer, such that the intermetallic compound layer seals the stress mitigation layer therein;
wherein the stress mitigation layer is capable of transitioning to a liquid state in response to the semiconductor device generating thermal energy.

13. The power electronic assembly of claim 12, wherein the liquid state of the stress mitigation layer is capable of mitigating thermally induced stresses generated by the semiconductor device.

14. The power electronic assembly of claim 12, wherein the intermetallic compound layer is capable of maintaining the stress mitigation layer while the stress mitigation layer is in the liquid state.

15. The power electronic assembly of claim 12, wherein the stress mitigation layer comprises a lower melting temperature relative to the intermetallic compound layer.

16. The power electronic assembly of claim 12, wherein the stress mitigation layer comprises indium or tin.

17. A method of manufacturing an assembly comprising a stress mitigation layer having a low melting temperature, the method comprising:
depositing a first metallic interlayer on a second substrate;
depositing the stress mitigation layer on the first metallic interlayer;
depositing a second metallic interlayer on the stress mitigation layer;
depositing a first substrate on the second metallic interlayer;
heating the assembly such that the first and the second interlayers diffuse into the first substrate and the second substrate thereby forming an intermetallic compound layer between the first substrate and the second substrate, wherein the stress mitigation layer melts into a liquid in response to heating the assembly; and
cooling the assembly to solidify the intermetallic compound layer between the first substrate and the second substrate, wherein the stress mitigation layer hardens into a solid in response to cooling the assembly.

18. The method of claim 17, wherein the first substrate includes a copper or nickel interface such that the copper or nickel interface of the first substrate is positioned against the second metallic interlayer.

19. The method of claim 18, further comprising maintaining the stress mitigation layer within the intermetallic compound layer as the stress mitigation layer melts into a liquid.

20. The method of claim 19, wherein the first and the second metallic interlayers comprise platinum.

* * * * *